(12) United States Patent
Takemura (10) Patent No.: US 8,897,028 B2
(45) Date of Patent: Nov. 25, 2014

(54) CIRCUIT MODULE

(75) Inventor: Tadaji Takemura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 205 days.

(21) Appl. No.: 13/156,496

(22) Filed: Jun. 9, 2011

(65) Prior Publication Data
US 2011/0304993 A1 Dec. 15, 2011

(30) Foreign Application Priority Data
Jun. 11, 2010 (JP) ................. 2010-134250

(51) Int. Cl.
| | | |
|---|---|---|
| H05K 7/00 | (2006.01) | |
| H01L 23/31 | (2006.01) | |
| H01L 23/498 | (2006.01) | |
| H01L 23/552 | (2006.01) | |
| H01L 25/16 | (2006.01) | |
| H05K 1/02 | (2006.01) | |
| H05K 1/18 | (2006.01) | |
| H05K 7/14 | (2006.01) | |
| H05K 7/18 | (2006.01) | |
| H05K 1/11 | (2006.01) | |
| H05K 1/14 | (2006.01) | |
| H05K 9/00 | (2006.01) | |
| H01L 23/28 | (2006.01) | |
| H01L 25/065 | (2006.01) | |
| H05K 3/28 | (2006.01) | |

(52) U.S. Cl.
CPC ...... *H01L 23/3121* (2013.01); *H01L 23/49811* (2013.01); *H01L 23/552* (2013.01); *H01L 25/165* (2013.01); *H05K 9/0039* (2013.01); *H05K 1/0216* (2013.01); *H01L 25/0655* (2013.01); *H01L 2224/16225* (2013.01); *H01L 2924/19105* (2013.01); *H05K 3/284* (2013.01); *H05K 2201/09972* (2013.01); *H05K 2201/10371* (2013.01)

USPC .......... 361/777; 361/761; 361/799; 361/800; 361/804; 361/818; 174/521

(58) Field of Classification Search
USPC .......... 174/521; 361/761, 799, 800, 804, 816, 361/818; 257/787, 788, 789, 790
See application file for complete search history.

(56) References Cited

U.S. PATENT DOCUMENTS 6,469,912 B1 * 10/2002 Chuang .................. 361/816
7,557,307 B2 * 7/2009 Nishizawa et al. .......... 174/384
(Continued)

FOREIGN PATENT DOCUMENTS

| JP | 62-118500 U | 7/1987 |
|---|---|---|
| JP | 2001-267095 A | 9/2001 |

(Continued)

OTHER PUBLICATIONS

Official Communication issued in corresponding Japanese Patent Application No. 2010-134250, mailed on Sep. 25, 2012.

*Primary Examiner* — Hoa C Nguyen
*Assistant Examiner* — Binh Tran
(74) *Attorney, Agent, or Firm* — Keating & Bennett, LLP (57) ABSTRACT

In a circuit module, a conductive partition is defined by a plurality of conductive chips provided on a component mounting surface. The component mounting surface is divided into a first block and a second block by the conductive partition. The shape of the conductive partition can be freely changed in accordance with the size of a circuit board and the arrangement of electronic components in the first block and the second block by changing the positions of the conductive chips and the number of conductive chips. Electromagnetic interference between the first block and the second block is prevented by the conductive partition.

8 Claims, 9 Drawing Sheets

(56) References Cited

U.S. PATENT DOCUMENTS

| | | |
|---|---|---|
| 7,763,983 B2 * | 7/2010 | Honer et al. .................. 257/778 |
| 7,848,112 B2 * | 12/2010 | Matsumoto .................. 361/730 |
| 2008/0112151 A1 * | 5/2008 | Thompson et al. ........... 361/818 |
| 2009/0284947 A1 * | 11/2009 | Beddingfield et al. ........ 361/818 |
| 2010/0110656 A1 * | 5/2010 | Ko et al. ....................... 361/818 |

FOREIGN PATENT DOCUMENTS

| | | |
|---|---|---|
| JP | 2005-317935 A | 11/2005 |
| JP | 2009-212263 A | 9/2009 |

* cited by examiner

CIRCUIT MODULE

BACKGROUND OF THE INVENTION

1. Field of the Invention

The present invention relates to circuit modules, and, more particularly, to a circuit module in which a conductive partition is provided on a circuit board.

2. Description of the Related Art

Figure 7A:
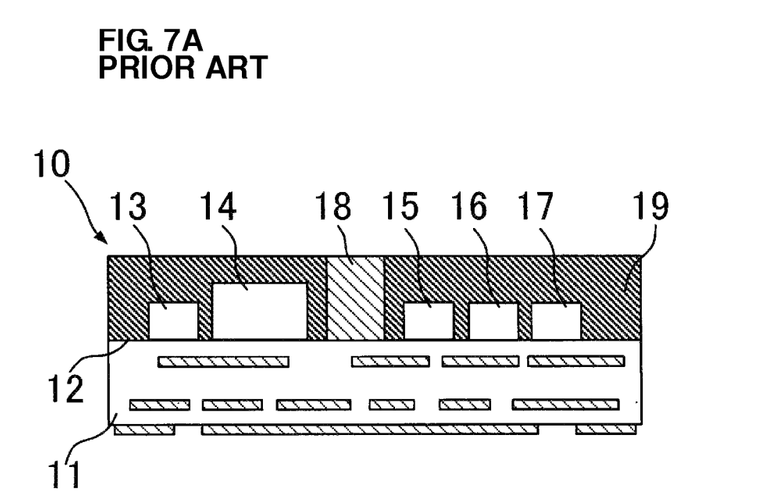
FIG. 7A is a cross-sectional view of a circuit module in the related art.
Figure 7B:
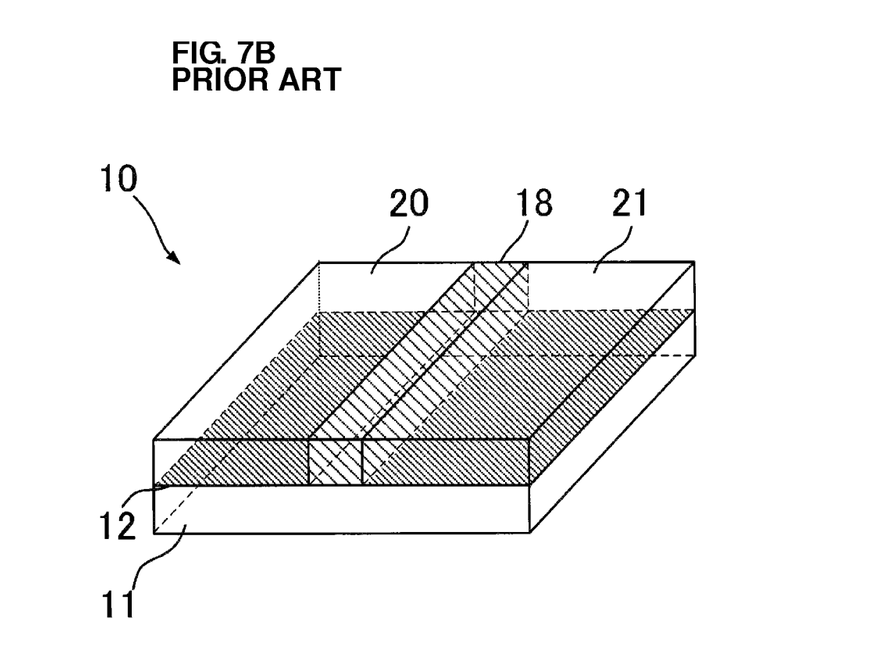
FIG. 7B is an external perspective view of a circuit module in the related art.

Circuit modules including a conductive partition for forming blocks of electronic components on a circuit board have been proposed. Such a circuit module is disclosed in, for example, Japanese Unexamined Patent Application Publication No. 2005-317935. FIGS. 7A and 7B illustrate the circuit module disclosed in Japanese Unexamined Patent Application Publication No. 2005-317935.

As illustrated in FIG. 7A, a circuit module 10 includes a circuit board 11 in which an electrode pattern is formed, electronic components 13 to 17 and a conductive partition 18 that are mounted on a component mounting surface 12 of the circuit board 11, and an insulating resin layer 19 that is formed on the circuit board 11 so that the electronic components 13 to 17 are covered and a portion of the conductive partition 18 is exposed.

As illustrated in FIG. 7B, the conductive partition 18 on the component mounting surface 12 is composed of a single continuous conductive member extending from one side to another side of the component mounting surface 12. Each of the electronic components 13 to 17 (not illustrated) is included in one of two different blocks 20 and 21 formed by the conductive partition 18.

The electronic components in the block 20 form a functional circuit, and the electronic components in the block 21 form another functional circuit. The conductive partition 18 reduces the electromagnetic interference between the electronic components in the block 20 and the electronic components in the block 21.

However, in the circuit module 10 in the related art, since the conductive partition 18 is composed of a single continuous conductive member, the conductive partition 18 lacks versatility.

That is, when the size of a circuit board or the position of each electronic component on the circuit board is changed, the shape of the conductive partition 18 must be changed to, for example, an L-shape or a T-shape in accordance with the change. This leads to an increase in the cost of manufacturing the circuit module 10.

Furthermore, when the insulating resin layer 19 is formed on the circuit board 11, fluidity of a resin between blocks (for example, the block 20 and the block 21 illustrated in FIG. 7B) is reduced because the conductive partition 18 is composed of a single continuous conductive member. It takes a long time to form a resin on the component mounting surface 12.

SUMMARY OF THE INVENTION

Preferred embodiments of the present invention provide a circuit module including a highly versatile conductive partition having a desired shape in accordance with a change in size of a circuit board and a change in position of an electronic component on the circuit board and an insulating resin layer having high fluidity on the circuit board.

A circuit module according to a preferred embodiment of the present invention includes a circuit board on which a plurality of electronic components are mounted and a conductive partition that is mounted on the circuit board along with the plurality of electronic components and is configured to define blocks of electronic components. The conductive partition is defined by a plurality of conductive chips.

In this case, since the conductive partition is not composed of a single continuous conductive member and is instead defined by the plurality of conductive chips provided on the circuit board, it is possible to freely change the shape of the conductive partition by changing the positions of the conductive chips on the circuit board and the number of conductive chips. As a result, there can be provided a circuit module including a conductive partition that has a desired shape in accordance with the size of a circuit board and the change in position of an electronic component on the circuit board.

The circuit board preferably includes a plurality of insulating layers in which in-plane wiring electrodes are provided and a via electrode passing through the plurality of insulating layers. The plurality of conductive chips are preferably electrically connected to a ground electrode via the in-plane wiring electrodes and the via electrode.

In this case, since the conductive chips are connected to the ground electrode, the shielding effect of the conductive partition is improved.

The circuit module preferably further includes an insulating resin layer that is arranged on the circuit board so that the insulating resin layer covers the plurality of electronic components and a shield conductive layer covering the insulating resin layer. The plurality of conductive chips are preferably partially exposed on the insulating resin layer, and are preferably connected to the shield conductive layer.

In this case, since the electronic components on the circuit board are covered with the shield conductive layer connected to the ground electrode, it is possible to prevent the electronic components from being affected by external electromagnetic wave noise. In addition, since the shield conductive layer is connected to the ground electrode at a plurality of points by the conductive chips, the shielding effect of the shield conductive layer is improved.

The circuit module preferably further includes a shield case that is arranged on the circuit board so that the shield case covers the plurality of electronic components. The plurality of conductive chips are preferably connected to the shield case.

In this case, since the electronic components on the circuit board are covered with the shield case connected to the ground electrode, it is possible to prevent the electronic components from being affected by external electromagnetic wave noise. In addition, since the shield case is connected to the ground electrode at a plurality of points by the conductive chips, the shielding effect of the shield case is improved.

An in-plane ground electrode is preferably provided on substantially an entire surface of at least one of the plurality of insulating layers. The in-plane ground electrode is preferably connected to the ground electrode via the in-plane wiring electrodes and the via electrode.

In this case, it is possible to prevent the electronic components from being affected by electromagnetic wave noise transmitted from a side of the circuit board.

The shield conductive layer or the shield case is preferably connected to the in-plane ground electrode on side surfaces of the circuit board.

In this case, it is possible to more reliably prevent the electronic components from being affected by electromagnetic wave noise transmitted from a side of the circuit board.

The conductive partition is preferably defined by the plurality of conductive chips being arranged so as to be spaced apart from one another. A distance between adjacent ones of the plurality of conductive chips is preferably equal to or shorter than an approximately one quarter-wavelength of an operational signal of the circuit module, for example.

In this case, it is possible to reliably prevent electromagnetic wave noise generated by each of the electronic components from passing through the conductive partition. In addition, since a resin can flow between the conductive chips, it is possible to form the insulating resin layer while keeping good fluidity.

Each of the plurality of conductive chips is preferably defined by a conductive material provided on a surface of a resin shaped product.

In this case, since each of the plurality of conductive chips is mainly made of a resin, the circuit module can be easily manufactured.

Each of the plurality of conductive chips preferably includes a base extending in a direction substantially perpendicular to a component mounting surface of the circuit board, a through-hole passing through the base in a direction substantially parallel to the component mounting surface, a supporting portion that extends from the base in a direction substantially parallel to the component mounting surface, is partially connected to the circuit board, and fixes the body on the circuit board, and a suction portion that is disposed on a surface of the body opposite the circuit board and is used for suction of the body.

In this case, the supporting portion allows the conductive chip to stand on the component mounting surface of the circuit board without falling down. Since each of the conductive chips includes the suction portion, an electronic component mounter can achieve suction on the suction portion and mount the conductive chips on the component mounting surface like other electronic components. Accordingly, the conductive chips can be easily arranged on the circuit board. Furthermore, since each of the conductive chips includes the through-hole, the fluidity of a resin material for the insulating resin layer is improved.

According to various preferred embodiments of the present invention, it is possible to provide a circuit module including a conductive partition having a desired shape in accordance with the size of a circuit board and the change in position of an electronic component on the circuit board.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings.

First Preferred Embodiment

The configuration of a circuit module 30 according to the first preferred embodiment of the present invention will be described with reference to FIGS. 1 to 5.

Figure 1:
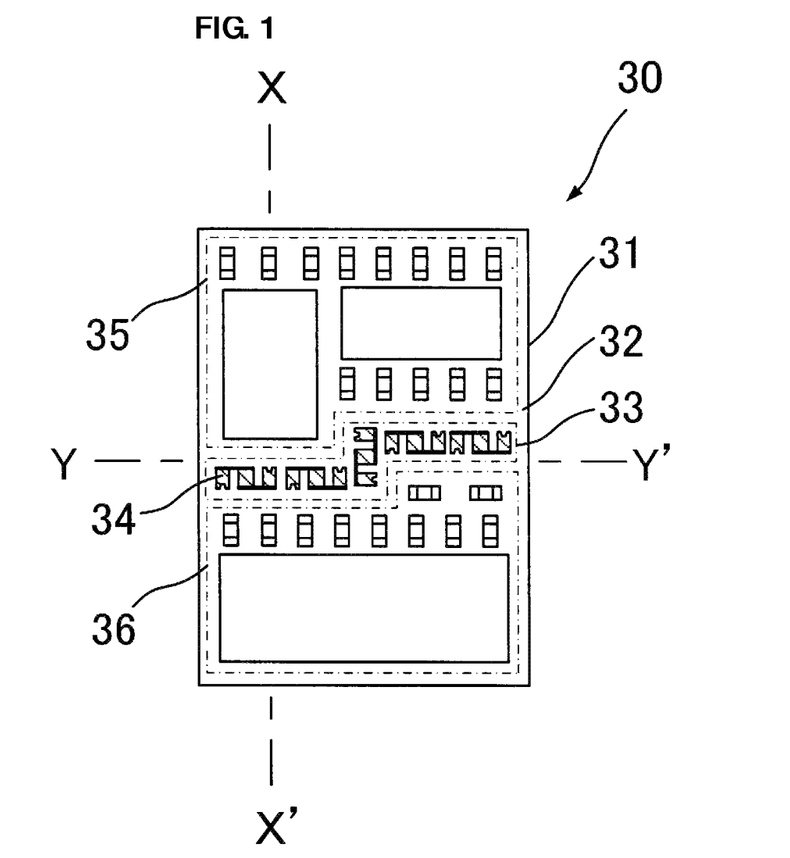
FIG. 1 is a plan view of a circuit module according to a first preferred embodiment of the present invention, excluding an insulating resin layer and a shield conductive layer.

FIG. 1 is a plan view of a component mounting surface 32 of the circuit module 30.

As illustrated in FIG. 1, the circuit module 30 includes a circuit board 31, electronic components mounted on the component mounting surface 32 of the circuit board 31, and a conductive partition 33.

The circuit board 31 includes a ceramic multilayer substrate mainly made of a ceramic material or a resin multilayer substrate mainly made of a resin material, and preferably is in the form of a substantially rectangular parallelepiped of dimensions approximately 30 mm×approximately 20 mm×approximately 1.6 mm, for example. The multilayer substrate is preferably obtained by laminating substrates in which in-plane wiring electrodes are provided, and the in-plane wiring electrodes are electrically connected to one another by a via electrode passing through the substrates.

The conductive partition 33 is obtained by mounting a plurality of conductive chips 34 on the component mounting surface 32. The configuration of the conductive chip 34 will be described in detail later.

The component mounting surface 32 is divided into a first block 35 and a second block 36 by the conductive partition 33 as illustrated in FIG. 1. The electronic components in the first block 35 define a functional circuit, and the electronic components in the second block 36 define another functional circuit.

For example, when the circuit module 30 is a module component in which a Bluetooth (registered trademark) circuit and an FM tuner circuit are integrated, electronic components in the first block 35 define the Bluetooth circuit and electronic components in the second block 36 define the FM tuner circuit.

In the circuit module 30, since the conductive partition 33 is provided between the first block 35 and the second block 36, electromagnetic interference between the electronic components in the first block 35 and the electronic components in the second block 36 is reliably prevented.

In addition, since the conductive partition 33 is defined by a plurality of conductive chips 34, it is possible to freely change the shape of the conductive partition 33 by changing the positions of the conductive chips 34 and the number of the conductive chips 34 in accordance with the size of the circuit board 31 and the arrangement of the electronic components in the first block 35 and the second block 36.

In this preferred embodiment, only a circuit module including a first block and a second block has been described. However, the component mounting surface of a circuit board may be divided into more than two blocks by a conductive partition according to a preferred embodiment of the present invention including a plurality of conductive chips in accordance with the function of a circuit module.

Next, the configuration of the circuit module 30 according to a preferred embodiment of the present invention will be described in more detail with reference to FIGS. 2 and 3.

Figure 2:
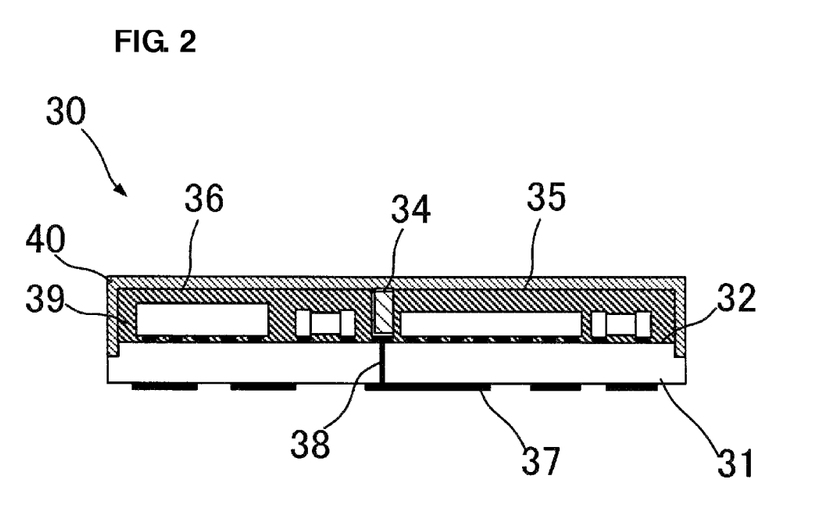
FIG. 2 is a cross-sectional view of a circuit module according to the first preferred embodiment of the present invention.

FIG. 2 is a cross-sectional view of the circuit module taken along a line X-X' of FIG. 1. FIG. 3 is a cross-sectional view of the circuit module, excluding an insulating resin layer, taken along a line Y-Y' of FIG. 1.

Figure 3:
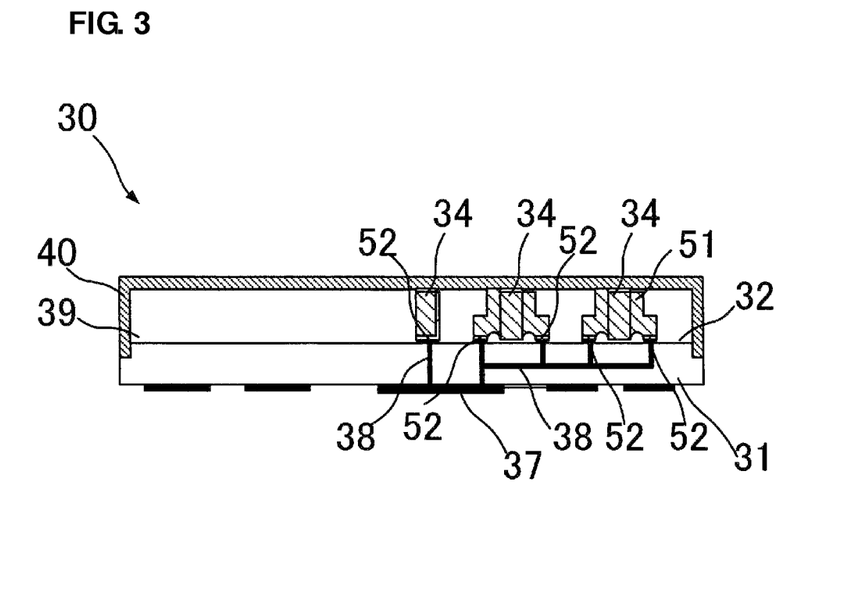
FIG. 3 is a cross-sectional view of a circuit module according to the first preferred embodiment of the present invention, excluding an insulating resin layer.

As illustrated in FIG. 3, the conductive partition 33 includes the conductive chips 34 that are spaced apart from one another on the component mounting surface 32. It is desirable that the distance between adjacent ones of the conductive chips 34 be equal to or shorter than approximately one quarter-wavelength of an operational signal of the circuit module 30, for example.

An insulating resin layer 39 is arranged on the circuit board 31 so that the electronic components on the component mounting surface 32 are covered and the conductive chips 34 are partially exposed on a surface of the insulating resin layer 39.

It is desirable that the insulating resin layer 39 be made of a thermosetting resin such as an epoxy resin. In order to control a strength, a dielectric constant, a temperature characteristic, and a viscosity, a filler component such as ceramic may be contained in a material of the insulating resin layer 39.

The insulating resin layer 39 achieves the strong connections of each of the electronic components on the component mounting surface 32 and the conductive partition 33 to the circuit board 31, and protects the electronic components and the conductive chips 34 from an external environment.

A shield conductive layer 40 is arranged to cover the surface of the insulating resin layer 39, and is connected to the conductive chips 34.

In order to connect the shield conductive layer 40 to the conductive chips 34, the insulating resin layer 39 is arranged so that the conductive chips 34 are partially exposed on the top surface of the insulating resin layer 39. For example, the top surface of the insulating resin layer 39 may be ground until the conductive chips 34 are partially exposed. Alternatively, the insulating resin layer 39 may have a height lower than that of the conductive chips 34 in advance so that the conductive chips 34 are partially exposed.

The shield conductive layer 40 is preferably made of, for example, a conductive resin containing a conductive component. A conductive component (filler) contained in a conductive resin is, for example, Ag, Cu, or Ni, and a synthetic resin (binder) containing a conductive component is, for example, an epoxy resin, a phenol resin, a urethane resin, a silicon resin, a polyester resin, an acryl resin, or a polyimide resin.

External-connection electrodes including a ground electrode 37 are provided on the undersurface of the circuit board 31. In the circuit board 31, a wiring pattern 38 including an in-plane wiring electrode and a via electrode is provided.

The conductive chips 34 are electrically connected to the ground electrode 37 via the wiring pattern 38. The shield conductive layer 40 is electrically connected to the ground electrode 37 via the conductive chips 34 and the wiring pattern 38.

Since the conductive chips 34 are connected to the ground electrode 37 as described previously, the shielding effect of the conductive partition 33 is increased.

Thus, the shield conductive layer 40 is connected to the ground electrode 37 at a plurality of points by the conductive chips 34, and covers the electronic components on the circuit board 31. Accordingly, it is possible to prevent the circuit module 30 from being affected by external electromagnetic wave noise.

The conductive chips 34 are arranged at regular intervals on the circuit board 31. A resin material can therefore flow between the conductive chips 34 so as to define the insulating resin layer 39. As a result, it is possible to form the insulating resin layer 39 on the component mounting surface 32 of the circuit board 31 while maintaining good fluidity of the insulating resin layer 39. In addition, by setting the distance between the conductive chips 34 equal to or shorter than approximately one quarter-wavelength of an operational signal of the circuit module 30, for example, it is possible to prevent the electromagnetic interference between the first block 35 and the second block 36 with more certainty while maintaining the fluidity of the insulating resin layer 39.

In this preferred embodiment, a ground electrode is preferably provided on only the undersurface of the circuit board 31. The position of the ground electrode may be changed in accordance with an external connection method. For example, the ground electrode may be located on the side surface or both the side surface and the undersurface of the circuit board 31.

Next, the configuration of the conductive chips 34 will be described with reference to FIGS. 4A to 4C.

Figure 4A:
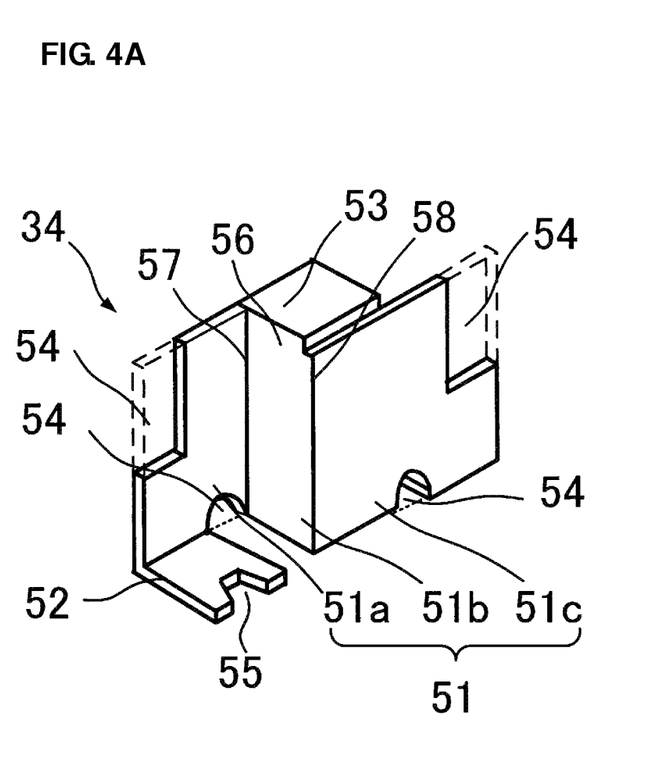
FIG. 4A is an external perspective view of a conductive chip in a circuit module according to the first preferred embodiment of the present invention.

FIG. 4A is an external perspective view of the conductive chip 34 in a circuit module according to a preferred embodiment of the present invention. FIG. 4B is a plan view of the conductive chip 34 in a circuit module according to a preferred embodiment of the present invention. FIG. 4C is a side view of the conductive chip 34 in a circuit module according to a preferred embodiment of the present invention.

Figure 4B:
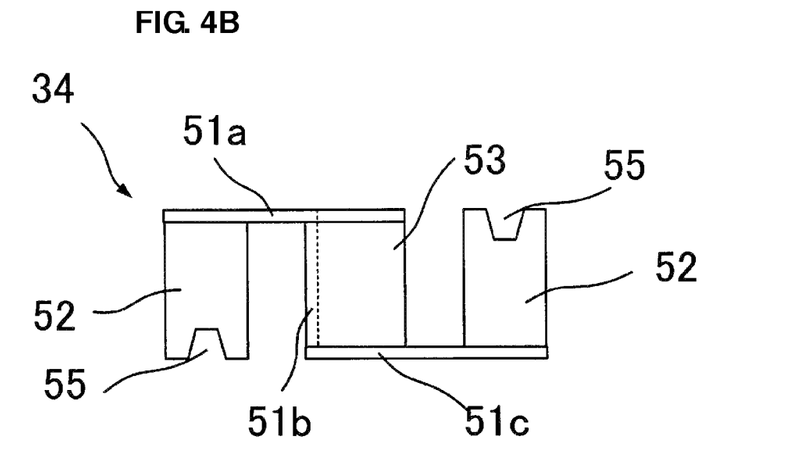
FIG. 4B is a plan view of a conductive chip in a circuit module according to the first preferred embodiment of the present invention.
Figure 4C:
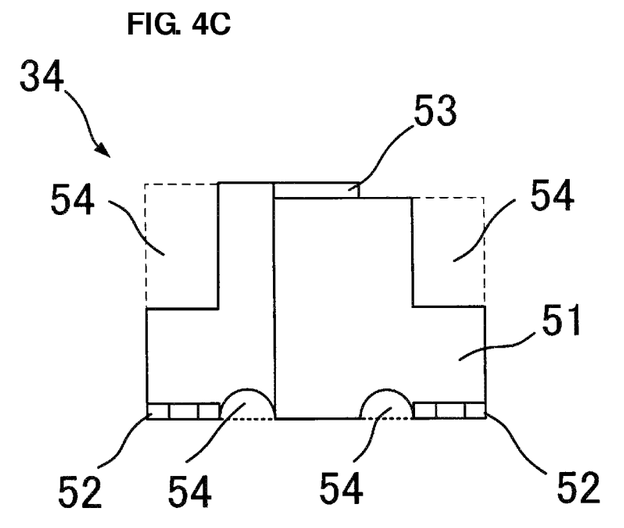
FIG. 4C is a side view of a conductive chip in a circuit module according the first preferred embodiment of the present invention.

As illustrated in FIGS. 4A to 4C, the conductive chip 34 includes a base 51, a supporting portion 52, and a suction portion 53.

The base 51 includes a first portion 51a, a second portion 51b, and a third portion 51c that are coupled to one another. The first portion 51a extends from one side 57 of the second portion 51b in a first direction substantially perpendicular to a main surface 56 of the second portion 51b, and the third portion 51c extends from a side 58 opposite the side 57 of the second portion 51b in a second direction that is substantially perpendicular to the main surface 56 of the second portion 51b and is opposite to the first direction. As illustrated in FIG. 4B, the conductive chip 34 preferably has a crank shape in plan view of the base 51.

The base 51 extends from the component mounting surface 32 in a direction substantially perpendicular to the component mounting surface 32, and is arranged to shield the circuit module 30 from electromagnetic wave noise.

The supporting portion 52 extends from both ends of a bottom surface of the base 51 in a direction substantially perpendicular to the base 51. Each of the supporting portions 52 has a predetermined area extending in a direction substantially parallel to the component mounting surface 32 so that it can support the base 51 when the conductive chips 34 are mounted on the circuit board 31. Furthermore, an opening 55 is provided at each of the supporting portions 52.

Thus, the conductive chips 34 including the supporting portions 52 do not easily fall down, and are stably mounted on the component mounting surface 32.

The conductive chips 34 can be more strongly connected to the circuit board 31 by connecting the supporting portions 52 to the circuit board 31 with solder or the like, because the openings 55 allow the solder to be applied not only to surfaces of the supporting portions 52 connected to the component mounting surface 32 but also to other surfaces of the supporting portions 52.

As illustrated in FIG. 3, the base 51 is mounted on the component mounting surface 32 via the supporting portions 52. Through-holes 54 are located at the base 51 on the component mounting surface 32, and pass through the base 51 in a direction parallel or substantially parallel to the component mounting surface 32. It is desirable that the maximum aperture length of the through-holes 54 be equal to or shorter than one quarter-wavelength of an operational signal of the circuit module 30, for example.

Thus, by providing the through-holes 54 at the base 51, a resin material can flow between the first block 35 and the second block 36 via the through-holes 54 so as to define the insulating resin layer 39. As a result, it is possible to provide the insulating resin layer 39 on the circuit board 31 while maintaining the fluidity of the insulating resin layer 39.

The suction portion 53 is provided on the top surface of the base 51 and is substantially perpendicular to the base 51. The suction portion 53 has a predetermined area extending in a direction substantially parallel to the supporting portions 52, that is, the component mounting surface 32, so that a suction nozzle of an electronic component mounter such as a chip mounter can achieve suction on the suction portion 53.

Since the suction portion 53 is provided at each of the conductive chips 34, it is possible for an electronic component mounter to easily mount the conductive chips 34 on the circuit board 31 like other electronic components.

The conductive chip 34 having the above-described configuration is made of a conductive material. For example, the conductive chip 34 can be formed by folding a metal plate made of an Al alloy.

The conductive chip 34 may be obtained by shaping a resin material into a predetermined shape and forming a conductive material on the surface of the shaped product. In this case, the conductive chip 34 preferably is mainly made of a resin material. For example, when the profile of a circuit module is reduced, it is therefore possible to easily process the circuit module by grinding the insulating resin layer 39 and the conductive chips 34.

The conductive chip 34 may be obtained by shaping a resin material into a predetermined shape and forming a conductive material in the shaped product.

In this case, since the resin material is exposed on the surface of the conductive chip 34, the contact between the conductive chip 34 and the insulating resin layer 39 is improved.

The present invention is not limited to the above-described preferred embodiment, and various changes may be made. For example, when the conductive chips 34 are mounted on the component mounting surface 32, the conductive chips 34 may be connected to one another. In this case, the conductive partition 33 including the conductive chips 34 connected to one another can prevent the occurrence of electromagnetic field noise with certainty.

Second Preferred Embodiment

Figure 5:
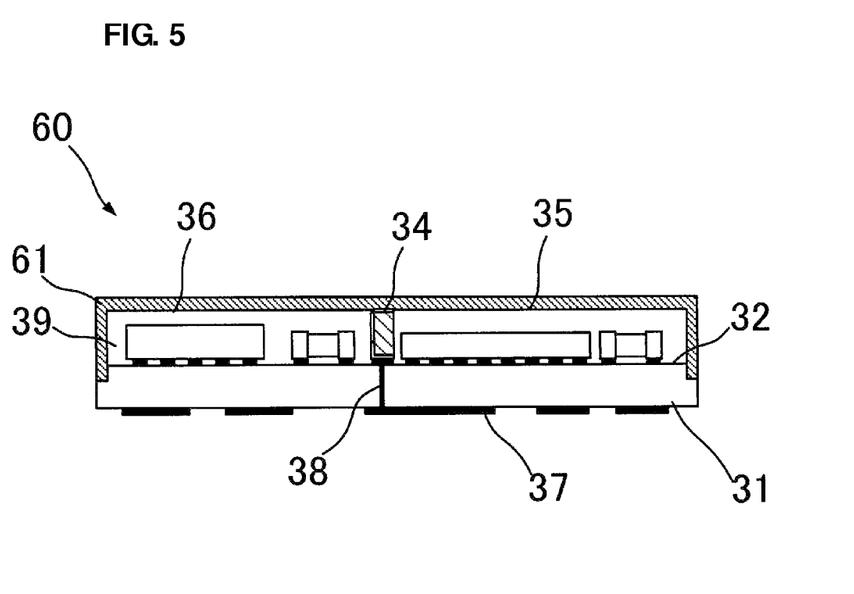
FIG. 5 is a cross-sectional view of a circuit module according to a second preferred embodiment of the present invention.

FIG. 5 is a cross-sectional view of a circuit module according to the second preferred embodiment of the present invention. A circuit module 60 according to the second preferred embodiment preferably has substantially the same configuration as that of a circuit module according to the first preferred embodiment except that it includes a shield case 61 functioning as a shield conductive layer, and the detailed description of other components designated by the same numerals as those of the first preferred embodiment will be therefore omitted.

As illustrated in FIG. 5, the shield case 61 is mounted on the circuit board 31 so that it covers electronic components and the conductive chips 34 on the component mounting surface 32. The shield case 61 has electrical conductivity, and is obtained by folding, for example, a metal plate made of an Al alloy.

The shield case 61 is electrically connected to the ground electrode 37 via the conductive chips 34 and the wiring pattern 38.

When the shield case 61 is connected to the conductive chips 34, for example, conductive paste is applied to the top surfaces of the conductive chips 34 and then the shield case 61 is mounted on the circuit board 31. As a result, the shield case 61 is connected to the conductive chips 34 via the conductive paste.

Alternatively, a method of forming openings at predetermined positions on the shield case 61, putting portions of the conductive chips 34 into the openings, and bringing the conductive chips 34 into contact with the shield case 61, may preferably be used.

In the circuit module 60 having the above-described configuration, since the electronic components on the circuit board 31 are covered with the shield case 61 connected to the ground electrode 37, it is possible to prevent the circuit module 60 from being affected by external electromagnetic wave noise.

When the shield case 61 is made of a metal plate, the resistance to shock externally applied to the circuit module 60 is improved.

Third Preferred Embodiment

Figure 6A:
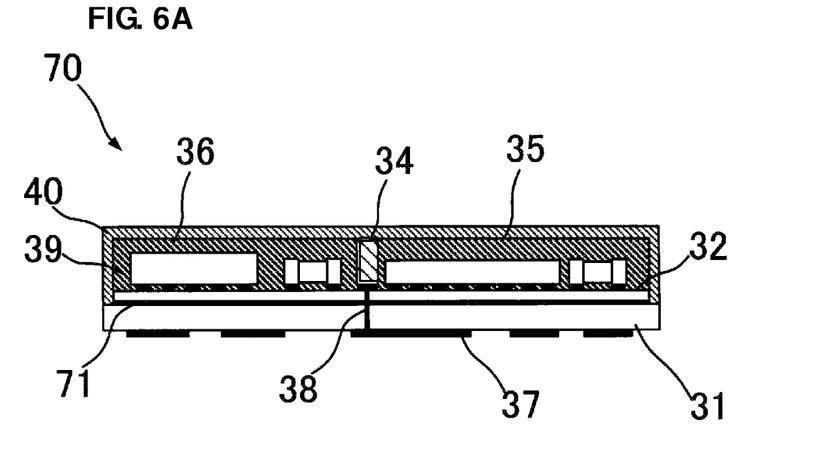
FIG. 6A is a cross-sectional view of a circuit module according to a third preferred embodiment of the present invention.

FIG. 6A is a cross-sectional view of a circuit module according to the third preferred embodiment of the present invention. A circuit module 70 according to the third preferred embodiment has substantially the same configuration as that of a circuit module according to the first preferred embodiment except that it includes an in-plane ground electrode 71 in the circuit board 31, and the detailed description of other components designated by the same numerals as those of the first preferred embodiment will be therefore omitted.

As illustrated in FIG. 6A, the in-plane ground electrode 71 is exposed on side surfaces of the circuit board 31 and are electrically connected to the shield conductive layer 40 covering the side surfaces. In addition, the in-plane ground electrode 71 is connected to the wiring pattern 38 in the circuit board 31, and is electrically connected to the ground electrode 37 via the wiring pattern 38.

Figure 6B:
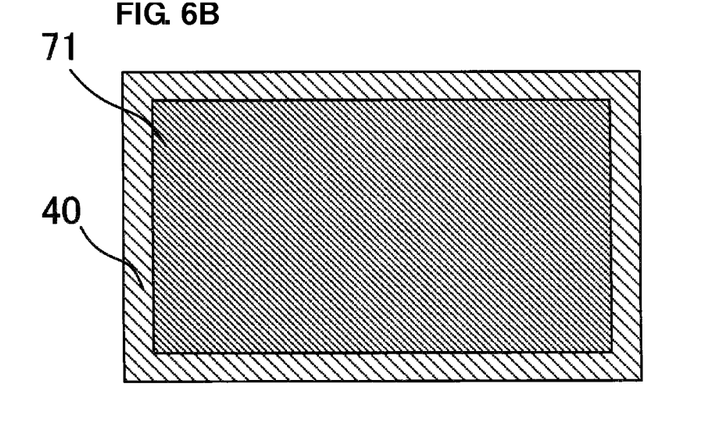
FIG. 6B is a plan view of a dielectric layer including an in-plane ground electrode.

FIG. 6B is a plan view of a dielectric layer including the in-plane ground electrode 71. As illustrated in FIG. 6B, the in-plane ground electrode 71 is a substantially rectangular electrode on substantially the entire surface of the dielectric layer, and is surrounded by the shield conductive layer 40. Accordingly, a closed space shielded by the shield conductive layer 40 and the in-plane ground electrode 71 is obtained. The electronic components are disposed on the component mounting surface 32 in the space.

Thus, by disposing the in-plane ground electrode 71, it is possible to prevent the electronic components on the component mounting surface 32 from being affected by electromagnetic noise transmitted through the circuit board 31. In addition, by electrically connecting the in-plane ground electrode 71 and the shield conductive layer 40 on the side surfaces of the circuit board 31, it is possible to dispose electronic components in closed space shielded by the in-plane ground electrode 71 and the shield conductive layer 40 and reliably prevent the electronic components from being affected by external electromagnetic wave noise.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
a circuit board including a component mounting surface on which a plurality of electronic components are mounted; and
a conductive partition that is provided on the component mounting surface of the circuit board along with the plurality of electronic components and is configured to define blocks of electronic components;
an insulating resin layer arranged on the circuit board so that the insulating resin layer covers the plurality of electronic components; and
a shield conductive layer covering the insulating resin layer; wherein
the conductive partition is defined by a plurality of conductive chips;
each of the plurality of conductive chips includes a base, a through-hole passing through the base in a direction parallel or substantially parallel to the component mounting surface, a supporting portion, and a suction portion;
the through-hole of each of the plurality of conductive chips is filled with a resin of the insulating resin layer; and
the plurality of conductive chips are partially exposed on the surface of the insulating resin layer, and are connected to the shield conductive layer.

2. The circuit module according to claim 1, wherein the circuit board includes a plurality of insulating layers in which in-plane wiring electrodes are provided and a via electrode passing through the plurality of insulating layers, and the plurality of conductive chips are electrically connected to a ground electrode via the in-plane wiring electrodes and the via electrode.

3. The circuit module according to claim 2, wherein an in-plane ground electrode is provided on substantially an entire surface of at least one of the plurality of insulating layers, and the in-plane ground electrode is connected to the ground electrode through the in-plane wiring electrodes and the via electrode.

4. The circuit module according to claim 3, wherein the shield conductive layer or the shield case is connected to the in-plane ground electrode on side surfaces of the circuit board.

5. The circuit module according to claim 1, further comprising a shield case arranged on the circuit board so that the shield case covers the plurality of electronic components, wherein the plurality of conductive chips are connected to the shield case.

6. The circuit module according to claim 1, wherein each of the plurality of conductive chips is defined by a conductive material provided on a surface of a resin shaped product.

7. The circuit module according to claim 1, wherein in each of the plurality of conductive chips, the base extends in a direction perpendicular or substantially perpendicular to the component mounting surface of the circuit board, the supporting portion extends from a surface of the base in a direction parallel or substantially parallel to the component mounting surface, is partially connected to the circuit board, and fixes a respective one of plurality of conductive chips on the circuit board, and the suction portion is disposed on a surface of the base opposite to the circuit board and is used for suction of the respective one of plurality of conductive chips.

8. The circuit module according to claim 1, wherein the conductive partition is defined by the plurality of conductive chips being spaced apart from one another, and a distance between adjacent ones of the plurality of conductive chips is equal to or shorter than an approximately one quarter-wavelength of a predetermined operational signal of the circuit module.

* * * * *